(12) United States Patent
Tain et al.

(10) Patent No.: US 11,631,626 B2
(45) Date of Patent: Apr. 18, 2023

(54) PACKAGE STRUCTURE

(71) Applicant: Unimicron Technology Corp., Taoyuan (TW)

(72) Inventors: Ra-Min Tain, Hsinchu County (TW); Po-Hsiang Wang, New Taipei (TW); Chi-Chun Po, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 176 days.

(21) Appl. No.: 17/206,108

(22) Filed: Mar. 18, 2021

(65) Prior Publication Data
US 2022/0108934 A1   Apr. 7, 2022

Related U.S. Application Data

(60) Provisional application No. 63/087,316, filed on Oct. 5, 2020.

(30) Foreign Application Priority Data

Feb. 1, 2021   (TW) .................................. 110103619

(51) Int. Cl.
*H01L 23/06*         (2006.01)
*H01L 23/367*        (2006.01)
(Continued)

(52) U.S. Cl.
CPC ...... *H01L 23/3675* (2013.01); *H01L 23/3121* (2013.01); *H01L 23/3735* (2013.01);
(Continued)

(58) Field of Classification Search
CPC .............. H01L 23/3121; H01L 23/495; H01L 23/49506; H01L 23/49568
(Continued)

(56) References Cited

U.S. PATENT DOCUMENTS 7,317,243 B2 * 1/2008 Wang .................. H01L 21/6835
                                                        438/125
7,728,413 B2 * 6/2010 Iwade ................. H01L 23/3107
                                                        438/122
(Continued)

FOREIGN PATENT DOCUMENTS

| CN | 109661723 | 4/2019 |
| TW | 200520125 | 6/2005 |
| TW | 201732968 | 9/2017 |

OTHER PUBLICATIONS

"Office Action of Taiwan Counterpart Application", dated Oct. 28, 2021, p. 1-p. 9.

*Primary Examiner* — Nitin Parekh
(74) *Attorney, Agent, or Firm* — JCIPRNET

(57) ABSTRACT

A package structure includes a first circuit board, a second circuit board, at least one electronic component, at least one conductive lead, and a molding compound. The first circuit board includes a first circuit layer and a second circuit layer. The second circuit board includes a third circuit layer and a fourth circuit layer. The electronic component is disposed between the first circuit board and the second circuit board. The conductive lead contacts at least one of the second circuit layer and the third circuit layer. The conductive lead has a vertical height, and the vertical height is greater than a vertical distance between the second circuit layer and the third circuit layer. The molding compound covers the first circuit board, the second circuit board, the electronic component, and the conductive lead. The molding compound exposes the first circuit layer and the fourth circuit layer, and the conductive lead extends outside the molding compound.

15 Claims, 2 Drawing Sheets

(51) Int. Cl.
*H01L 23/31* (2006.01)
*H01L 23/373* (2006.01)
*H01L 23/00* (2006.01)
*H01L 25/065* (2023.01)

(52) U.S. Cl.
CPC ............. *H01L 24/32* (2013.01); *H01L 24/48* (2013.01); *H01L 25/0655* (2013.01); *H01L 2224/32225* (2013.01); *H01L 2224/48225* (2013.01); *H01L 2924/15787* (2013.01)

(58) Field of Classification Search
USPC ........................................ 257/701, 666, 676
See application file for complete search history.

(56) References Cited

U.S. PATENT DOCUMENTS

| | | | |
|---|---|---|---|
| 7,936,054 B2* | 5/2011 | Eom | H01L 23/3107 |
| | | | 257/676 |
| 10,741,500 B2 | 8/2020 | Huang et al. | |
| 2006/0071314 A1 | 4/2006 | Ho et al. | |
| 2006/0108700 A1* | 5/2006 | Nakazawa | H01L 25/072 |
| | | | 257/E23.092 |
| 2009/0174046 A1* | 7/2009 | Liu | H01L 23/4951 |
| | | | 257/676 |
| 2010/0176498 A1* | 7/2010 | Lee | H01L 25/162 |
| | | | 257/E23.08 |
| 2013/0168845 A1* | 7/2013 | Aoshima | H01L 23/3675 |
| | | | 257/712 |
| 2016/0118314 A1* | 4/2016 | Ko | H01L 23/49548 |
| | | | 257/712 |
| 2018/0240731 A1* | 8/2018 | Choi | H01L 23/3735 |

* cited by examiner

PACKAGE STRUCTURE

CROSS-REFERENCE TO RELATED APPLICATION

This application claims the priority benefit of U.S. provisional application Ser. No. 63/087,316, filed on Oct. 5, 2020 and Taiwan application serial no. 110103619, filed on Feb. 1, 2021. The entirety of each of the above-mentioned patent applications is hereby incorporated by reference herein and made a part of this specification.

BACKGROUND

Technical Field

The disclosure relates to a semiconductor structure, and more particularly to a package structure.

Description of Related Art

To solve the heat dissipation problem, the package structure of a new power module has evolved to adopt the solution of double-sided heat dissipation. Generally, power modules require thicker conductive leads (a thickness greater than 0.5 mm) for signal transmission because of their higher power. However, the thickness of a power chip is only about 100 microns, so a conductive spacer is added between the upper and lower circuit boards to maintain the distance between the upper and lower circuit boards to accommodate the conductive leads. As a result, in addition to increasing the thickness of the overall power module, the conductive spacer itself also has thermal resistance, which further affects the overall heat dissipation efficiency of the power module.

SUMMARY

The disclosure provides a package structure capable of having a thinner package thickness and better performance in heat dissipation without adopting conductive spacers.

In the disclosure, a package structure includes a first circuit board, a second circuit board, at least one electronic component, at least one conductive lead, and a molding compound. The first circuit board includes a first circuit layer and a second circuit layer. The second circuit board includes a third circuit layer and a fourth circuit layer. The second circuit layer and the third circuit layer are located between the first circuit layer and the fourth circuit layer. The electronic component is disposed between the first circuit board and the second circuit board and electrically connected to the second circuit layer and the third circuit layer. The conductive lead contacts at least one of the second circuit layer and the third circuit layer. The conductive lead has a vertical height, and the vertical height is greater than a vertical distance between the second circuit layer and the third circuit layer. The molding compound covers the first circuit board, the second circuit board, the electronic component, and the conductive lead. The molding compound exposes the first circuit layer and the fourth circuit layer, and the conductive lead extends outside the molding compound.

In an embodiment of the disclosure, the first circuit board further includes a dielectric layer having an upper surface and a lower surface opposite to each other. The first circuit layer is disposed on the upper surface, and the second circuit layer is disposed on the lower surface.

In an embodiment of the disclosure, the material of the dielectric layer includes a ceramic material or a thermal interface material (TIM).

In an embodiment of the disclosure, the second circuit board further includes a dielectric layer having an upper surface and a lower surface opposite to each other. The third circuit layer is disposed on the upper surface, and the fourth circuit layer is disposed on the lower surface.

In an embodiment of the disclosure, the material of the dielectric layer includes a ceramic material or a thermal interface material.

In an embodiment of the disclosure, the first circuit board has a first edge and a second edge opposite to each other. The second circuit board has a third edge and a fourth edge opposite to each other. There is a first horizontal distance between the first edge and the third edge, and there is a second horizontal distance between the second edge and the fourth edge.

In an embodiment of the disclosure, the size of the first circuit board is the same as the size of the second circuit board. The at least one conductive lead includes a first conductive lead and a second conductive lead. The first conductive lead is relatively adjacent to the first edge of the first circuit board and contacts the second circuit layer. The second conductive lead is relatively adjacent to the fourth edge of the second circuit board and contacts the third circuit layer.

In an embodiment of the disclosure, the first horizontal distance is equal to the second horizontal distance.

In an embodiment of the disclosure, the size of the first circuit board is less than the size of the second circuit board. The at least one conductive lead includes a first conductive lead and a second conductive lead. The first conductive lead is relatively adjacent to the third edge of the second circuit board and contacts the third circuit layer. The second conductive lead is relatively adjacent to the fourth edge of the second circuit board and contacts the third circuit layer.

In an embodiment of the disclosure, the orthographic projection of the first circuit board on the second circuit board does not overlap the orthographic projection of the first conductive lead on the second circuit board and the orthographic projection of the second conductive lead on the second circuit board.

In an embodiment of the disclosure, the first horizontal distance is greater than the second horizontal distance.

In an embodiment of the disclosure, the package structure further includes a solder layer disposed between the second circuit layer of the first circuit board and the electronic component and between the electronic component and the third circuit layer of the second circuit board.

In an embodiment of the disclosure, the package structure further includes a bonding wire electrically connected to the electronic component and the third circuit layer of the second circuit board.

In an embodiment of the disclosure, the electronic component includes at least one die or at least one package body.

In an embodiment of the disclosure, the molding compound has a top surface and a bottom surface opposite to each other. The top surface is aligned with a first surface of the first circuit layer that is relatively away from the second circuit layer. The bottom surface is aligned with a second surface of the fourth circuit layer that is relatively away from the third circuit layer.

Base on the above, in the design of the package structure in the disclosure, the conductive lead contacts at least one of the second circuit layer of the first circuit board and the third circuit layer of the second circuit board, and the vertical height of the conductive lead is greater than the vertical distance between the second circuit layer and the third circuit layer. Accordingly, in the disclosure, there is no need to adopt conductive spacers to maintain the distance between the first circuit board and the second circuit board, so the package structure in the disclosure may have a thinner package thickness. In addition, since the molding compound exposes the first circuit layer of the first circuit board and the fourth circuit layer of the second circuit board, the package structure in the disclosure may have better performance in heat dissipation.

In order to make the aforementioned features and advantages of the invention comprehensible, embodiments accompanied with drawings are described in detail below.

DESCRIPTION OF THE EMBODIMENTS

Figure 1:
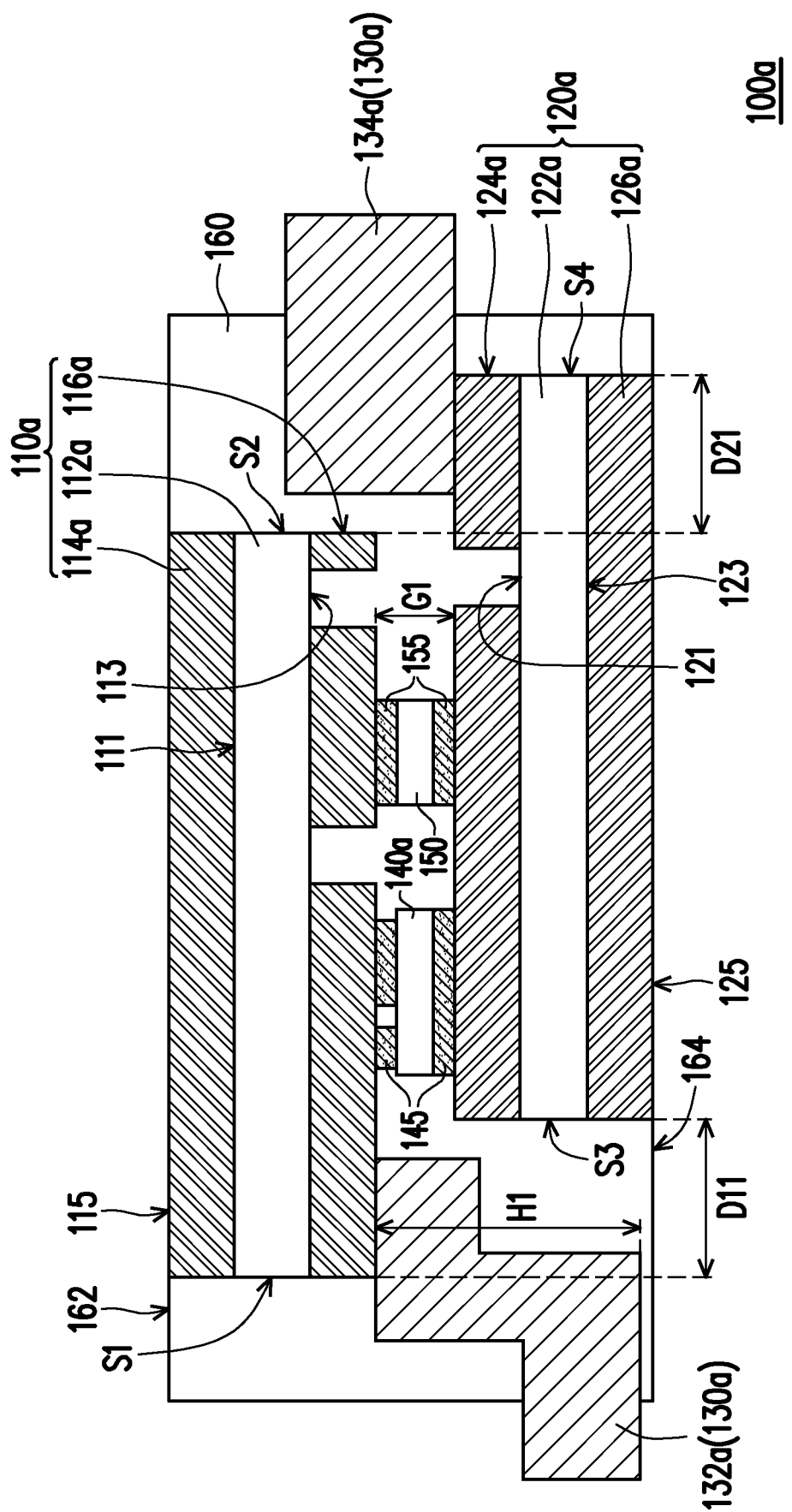
FIG. 1 is a schematic cross-sectional view of a package structure according to an embodiment of the disclosure.

FIG. 1 is a schematic cross-sectional view of a package structure according to an embodiment of the disclosure. Referring to FIG. 1, in the embodiment, a package structure 100a includes a first circuit board 110a, a second circuit board 120a, at least one conductive lead 130a, at least one electronic component (two electronic components 140a and 150 are schematically shown), and a molding compound 160.

In detail, the first circuit board 110a includes a dielectric layer 112a, a first circuit layer 114a, and a second circuit layer 116a. The dielectric layer 112a has an upper surface 111 and a lower surface 113 opposite to each other. For example, the material of the dielectric layer 112a may include a ceramic material or a thermal interface material, and for example, the thermal interface material may include an inorganic filler mixed with organic resin, but the disclosure is not limited thereto. The first circuit layer 114a is disposed on the upper surface 111 of the dielectric layer 112a and covers the entire upper surface 111. The second circuit layer 116a is disposed on the lower surface 113 of the dielectric layer 112a, and a part of the lower surface 113 is exposed. That is, the second circuit layer 116a is a patterned circuit layer.

Furthermore, the second circuit board 120a in the embodiment includes a dielectric layer 122a, a third circuit layer 124a, and a fourth circuit layer 126a. The dielectric layer 122a has an upper surface 121 and a lower surface 123 opposite to each other. For example, the material of the dielectric layer 122a may include a ceramic material or a thermal interface material, and for example, the thermal interface material may include an inorganic filler mixed with organic resin, but the disclosure is not limited thereto. The third circuit layer 124a is disposed on the upper surface 121 of the dielectric layer 122a, and a part of the upper surface 121 is exposed. That is, the third circuit layer 124a is a patterned circuit layer. The fourth circuit layer 126a is disposed on the lower surface 123 of the dielectric layer 122a and covers the entire lower surface 123.

As shown in FIG. 1, the second circuit layer 116a of the first circuit board 110a and the third circuit layer 124a of the second circuit board 120a in the embodiment are located between the first circuit layer 114a and the fourth circuit layer 126a. The size of the first circuit board 110a and the size of the second circuit board 120a are substantially the same. Furthermore, the first circuit board 110a has a first edge S1 and a second edge S2 opposite to each other. The second circuit board 120a has a third edge S3 and a fourth edge S4 opposite to each other. There is a first horizontal distance D11 between the first edge S1 and the third edge S3, and there is a second horizontal distance D21 between the second edge S2 and the fourth edge S4. The first horizontal distance D11 is substantially equal to the second horizontal distance D21. In other words, the first circuit board 110a and the second circuit board 120a in the embodiment are disposed in a staggered manner. On the other hand, the orthographic projection of the first circuit board 110a on the second circuit board 120a partially overlaps the second circuit board 120a.

Furthermore, the electronic components 140a and 150 in the embodiment are disposed between the first circuit board 110a and the second circuit board 120a and electrically connected to the second circuit layer 116a and the third circuit layer 124a. Meanwhile, for example, the electronic components 140a and 150 are dies or package bodies, which is not limited in the disclosure. More specifically, the package structure 100a in the embodiment further includes a solder layer 145 and a solder layer 155. The solder layer 145 is disposed between the second circuit layer 116a of the first circuit board 110a and the electronic component 140a and between the electronic component 140a and the third circuit layer 124a of the second circuit board 120a. The solder layer 155 is disposed between the second circuit layer 116a of the first circuit board 110a and the electronic component 150 and between the electronic component 150 and the third circuit layer 124a of the second circuit board 120a. In other words, the electronic components 140a and 150 in the embodiment are electrically connected to the first circuit board 110a and the second circuit board 120a through the solder layers 145 and 155.

Referring to FIG. 1 again, in the embodiment, the conductive lead 130a contacts at least one of the second circuit layer 116a and the third circuit layer 124a. In detail, the conductive lead 130a in the embodiment includes a first conductive lead 132a and a second conductive lead 134a. The first conductive lead 132a has a vertical height H1, there is a vertical distance G1 between the second circuit layer 116a and the third circuit layer 124a, and in particular the vertical height H1 is greater than the vertical distance G1. Similarly, the vertical height of the second conductive lead 134a is also greater than the vertical distance G1. That is, in the embodiment, the conductive lead 132a is not located between the second circuit layer 116a of the first circuit board 110a and the third circuit layer 124a of the second circuit board 120a. Specifically, the first conductive lead 132a is relatively adjacent to the first edge S1 of the first circuit board 110a and directly contacts the second circuit layer 116a. The second conductive lead 134a is relatively adjacent to the fourth edge S4 of the second circuit board 120a and directly contacts the third circuit layer 124a. That is, the first conductive lead 132a is electrically connected to the second circuit layer 116a of the first circuit board 110a, and the second conductive lead 134a is electrically connected to the third circuit layer 124a of the second circuit board 120a. In other words, the first conductive lead 132a and the second conductive lead 134a are respectively connected to different circuit boards.

In addition, the molding compound 160 in the embodiment covers the first circuit board 110a, the second circuit board 120a, the electronic components 140a and 150, the first conductive lead 132a, and the second conductive lead 134a. In particular, the molding compound 160 exposes the first circuit layer 114a and the fourth circuit layer 126a, and the first conductive lead 132a and the second conductive lead 134a extend outside the molding compound 160. Furthermore, the molding compound 160 has a top surface 162 and a bottom surface 164 opposite to each other. The top surface 162 is aligned with a first surface 115 of the first circuit layer 114a that is relatively away from the second circuit layer 116a. The bottom surface 164 is aligned with a second surface 125 of the fourth circuit layer 126a that is relatively away from the third circuit layer 124a. That is, the molding compound 160 in the embodiment does not cover the entire first circuit board 110a and the entire second circuit board 120a but exposes the first circuit layer 114a and the fourth circuit layer 126a, which may effectively improve the performance of the package structure 100a in heat dissipation. On the other hand, the molding compound 160 does not cover the entire conductive lead 130a, and the part of the conductive leads 130a extending outside the molding compound 160 may be adapted to transmit signals.

In short, in the embodiment, the conductive lead 130a contacts the second circuit layer 116a of the first circuit board 110a and the third circuit layer 124a of the second circuit board 120a, and the vertical height H1 of the first conductive lead 132a is greater than the vertical distance G1 between the second circuit layer 116a and the third circuit layer 124a. Accordingly, in the embodiment, there is no need to adopt conductive spacers to maintain the distance between the first circuit board 110a and the second circuit board 120a, so the package structure 100a in the embodiment may have a thinner package thickness. In addition, since the molding compound 160 exposes the first circuit layer 114a of the first circuit board 110a and the fourth circuit layer 126a of the second circuit board 120a, the package structure 100a in the embodiment may have better performance in heat dissipation.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
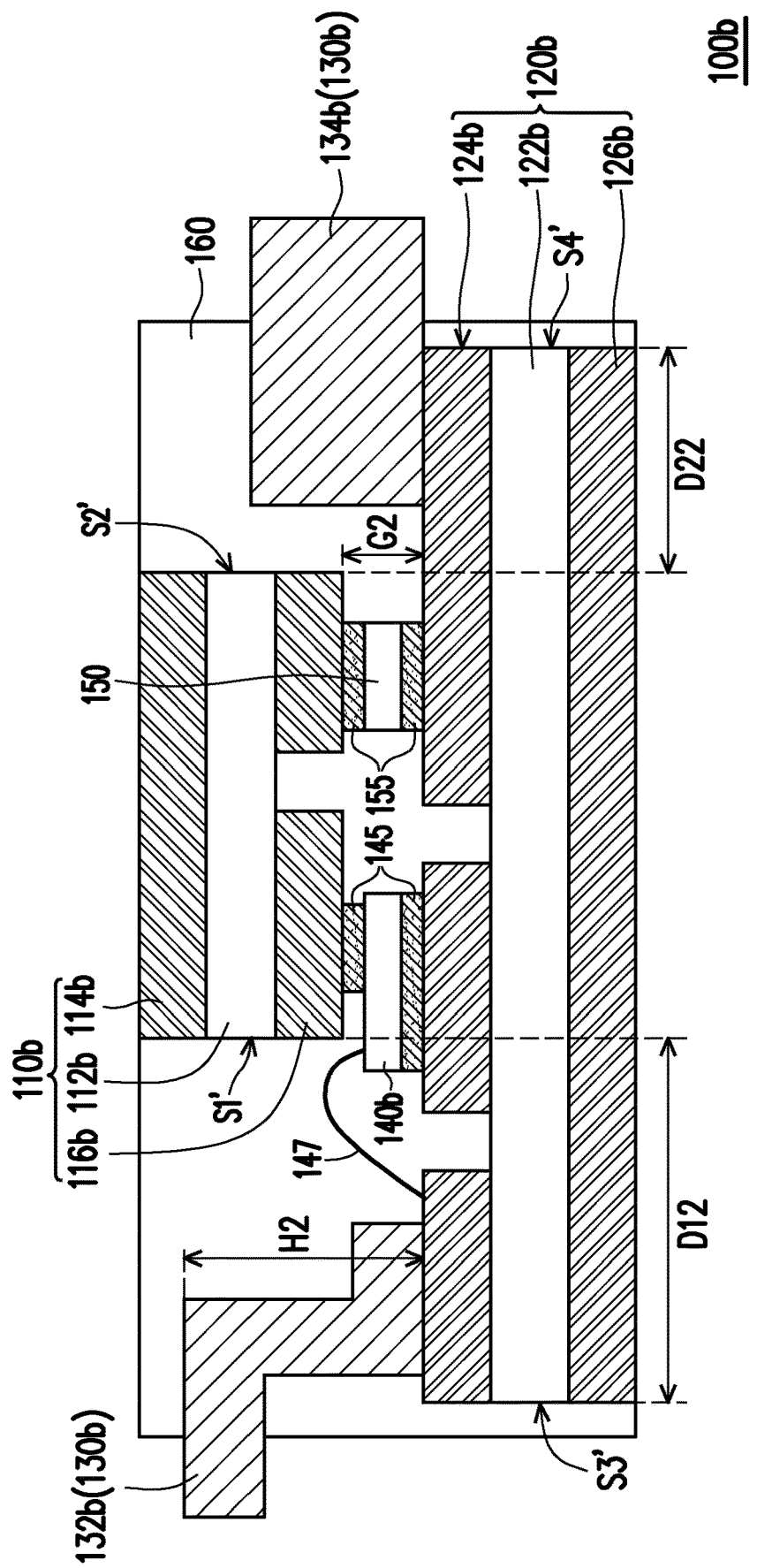
FIG. 2 is a schematic cross-sectional view of a package structure according to another embodiment of the disclosure.

FIG. 2 is a schematic cross-sectional view of a package structure according to another embodiment of the disclosure. Referring to both FIG. 1 and FIG. 2, the package structure 100b in the embodiment is similar to the package structure 100a. The difference between the two is in the embodiment, the size of the first circuit board 110b is less than that of the second circuit board 120b.

In detail, the first circuit board 110b includes a dielectric layer 112b, a first circuit layer 114b, and a second circuit layer 116b located on opposite sides of the dielectric layer 112b. The second circuit board 120b includes a dielectric layer 122b, a third circuit layer 124b, and a fourth circuit layer 126b located on opposite sides of the dielectric layer 122b. There is a first horizontal distance D12 between a first edge S1' of the first circuit board 110b and a third edge S3' of the second circuit board 120b, and there is a second horizontal distance D22 between a second edge S2' of the first circuit board 110b and a fourth edge S4' of the second circuit board 120b. Meanwhile, the first horizontal distance D12 is greater than the second horizontal distance D22.

Furthermore, the conductive lead 130b in the embodiment includes a first conductive lead 132b and a second conductive lead 134b. The first conductive lead 132b is relatively adjacent to the third edge S3' of the second circuit board 120b and directly contacts the third circuit layer 124b. The second conductive lead 134b is relatively adjacent to the fourth edge S4' of the second circuit board 120b and directly contacts the third circuit layer 124b. That is, the first conductive lead 132b and the second conductive lead 134b are electrically connected to the same circuit board (i.e., the second circuit board 120b). In particular, the first conductive lead 132b has a vertical height H2, there is a vertical distance G2 between the second circuit layer 116b and the third circuit layer 124b, and the vertical height H2 is greater than the vertical distance G2. Similarly, the vertical height of the second conductive lead 134b is also greater than the vertical distance G2. That is, the first conductive lead 132b and the second conductive lead 134b are not located between the second circuit layer 116b of the first circuit board 110b and the third circuit layer 124b of the second circuit board 120b.

On the other hand, in the embodiment, the orthographic projection of the first circuit board 110b on the second circuit board 120b does not overlap the orthographic projection of the first conductive leads 132b on the second circuit board 120b and the orthographic projection of the second conductive leads 134b on the second circuit board 120b. As shown in FIG. 2, the first circuit board 110b in the embodiment is located between the first conductive lead 132b and the second conductive lead 134b. In addition, the package structure 100b in the embodiment further includes a bonding wire 147, and the bonding wire 147 is electrically connected to the electronic component 140b and the third circuit layer 124b of the second circuit board 120b. That is, in addition to being electrically connected to the second circuit layer 116b and the third circuit layer 124b through the solder layer 145, the electronic component 140b in the embodiment is also electrically connected to the third circuit layer 124b through the bonding wire 147.

In short, in the design of the package structure 100b in the embodiment, the conductive lead 130b directly contacts the third circuit layer 124b of the second circuit board 120b, and the vertical height H2 of the first conductive lead 132b is greater than the vertical distance G2 between the second circuit layer 116b and the third circuit layer 124b. Therefore, in the embodiment, the package structure 100b does not need to adopt conductive spacers and therefore may have a thinner package thickness. In addition, since the molding compound 160 exposes the first circuit layer 114b of the first circuit board 110b and the fourth circuit layer 126b of the second circuit board 120b, the package structure 100b in the embodiment may have better performance in heat dissipation.

Base on the above, in the design of the package structure in the disclosure, the conductive lead contacts at least one of the second circuit layer of the first circuit board and the third circuit layer of the second circuit board, and the vertical height of the conductive lead is greater than the vertical distance between the second circuit layer and the third circuit layer. Accordingly, in the disclosure, there is no need to adopt conductive spacers to maintain the distance between the first circuit board and the second circuit board, so the package structure in the disclosure may have a thinner package thickness. In addition, since the molding compound exposes the first circuit layer of the first circuit board and the fourth circuit layer of the second circuit board, the package structure in the embodiment may have better performance in heat dissipation.

Although the invention has been described with reference to the above embodiments, it will be apparent to one of ordinary skill in the art that modifications to the described embodiments may be made without departing from the spirit and the scope of the invention. Accordingly, the scope of the invention will be defined by the attached claims and their equivalents and not by the above detailed descriptions.

What is claimed is:

1. A package structure, comprising:
   a first circuit board comprising a first circuit layer and a second circuit layer;
   a second circuit board comprising a third circuit layer and a fourth circuit layer, wherein the second circuit layer and the third circuit layer are located between the first circuit layer and the fourth circuit layer;
   at least one electronic component disposed between the first circuit board and the second circuit board and electrically connected to the second circuit layer and the third circuit layer;
   at least one conductive lead contacting at least one of the second circuit layer and the third circuit layer, wherein the at least one conductive lead comprises a maximum vertical height, and the maximum vertical height is greater than a vertical distance between a lower surface of the second circuit layer and an upper surface of the third circuit layer; and
   a molding compound covering the first circuit board, the second circuit board, the at least one electronic component, and the at least one conductive lead, wherein the molding compound exposes the first circuit layer and the fourth circuit layer, and the at least one conductive lead extends outside the molding compound.

2. The package structure according to claim 1, wherein the first circuit board further comprises a dielectric layer comprising an upper surface and a lower surface opposite to each other, the first circuit layer is disposed on the upper surface, and the second circuit layer is disposed on the lower surface.

3. The package structure according to claim 2, wherein a material of the dielectric layer comprises a ceramic material or a thermal interface material.

4. The package structure according to claim 1, wherein the second circuit board further comprises a dielectric layer comprising an upper surface and a lower surface opposite to each other, the third circuit layer is disposed on the upper surface, and the fourth circuit layer is disposed on the lower surface.

5. The package structure according to claim 4, wherein a material of the dielectric layer comprises a ceramic material or a thermal interface material.

6. The package structure according to claim 1, wherein the first circuit board comprises a first edge and a second edge opposite to each other, the second circuit board comprises a third edge and a fourth edge opposite to each other, there is a first horizontal distance between the first edge and the third edge, and there is a second horizontal distance between the second edge and the fourth edge.

7. The package structure according to claim 6, wherein a size of the first circuit board is the same as a size of the second circuit board, the at least one conductive lead comprises a first conductive lead and a second conductive lead, the first conductive lead is relatively adjacent to the first edge of the first circuit board and contacts the second circuit layer, and the second conductive lead is relatively adjacent to the fourth edge of the second circuit board and contacts the third circuit layer.

8. The package structure according to claim 7, wherein the first horizontal distance is equal to the second horizontal distance.

9. The package structure according to claim 6, wherein a size of the first circuit board is less than a size of the second circuit board as seen in a cross-sectional view, the at least one conductive lead comprises a first conductive lead and a second conductive lead, the first conductive lead is relatively adjacent to the third edge of the second circuit board and contacts the third circuit layer, and the second conductive lead is relatively adjacent to the fourth edge of the second circuit board and contacts the third circuit layer.

10. The package structure according to claim 9, wherein an orthographic projection of the first circuit board on the second circuit board does not overlap an orthographic projection of the first conductive lead on the second circuit board and an orthographic projection of the second conductive lead on the second circuit board.

11. The package structure according to claim 9, wherein the first horizontal distance is greater than the second horizontal distance.

12. The package structure according to claim 1, further comprising:
   a solder layer disposed between the second circuit layer of the first circuit board and the at least one electronic component and between the at least one electronic component and the third circuit layer of the second circuit board.

13. The package structure according to claim 12, further comprising:
   a bonding wire electrically connected to the at least one electronic component and the third circuit layer of the second circuit board.

14. The package structure according to claim 1, wherein the at least one electronic component comprises at least one die or at least one package body.

15. The package structure according to claim 1, wherein the molding compound comprises a top surface and a bottom surface opposite to each other, the top surface is aligned with a first surface of the first circuit layer that is relatively away from the second circuit layer, and the bottom surface is aligned with a second surface of the fourth circuit layer that is relatively away from the third circuit layer.

* * * * *